United States Patent
Ise et al.

(10) Patent No.: US 6,778,601 B2
(45) Date of Patent: Aug. 17, 2004

(54) ADAPTIVE AUDIO EQUALIZER APPARATUS AND METHOD OF DETERMINING FILTER COEFFICIENT

(75) Inventors: Tomohiko Ise, Iwaki (JP); Nozomu Saito, Iwaki (JP)

(73) Assignee: Alpine Electronics, Inc., Tokyo (JP)

(*) Notice: Subject to any disclaimer, the term of this patent is extended or adjusted under 35 U.S.C. 154(b) by 714 days.

(21) Appl. No.: 09/777,370

(22) Filed: Feb. 5, 2001

(65) Prior Publication Data

US 2001/0022812 A1 Sep. 20, 2001

(30) Foreign Application Priority Data

Feb. 17, 2000 (JP) ........................................ 2000-039221

(51) Int. Cl.[7] .............................. H04B 1/10; H04B 9/08
(52) U.S. Cl. ................... 375/232; 708/323; 381/71.11; 370/290; 379/406.06
(58) Field of Search ................................. 375/232, 233, 375/346, 350; 708/322, 323; 381/71.11, 71.12, 103; 370/289, 290, 291; 379/406.05, 406.08

(56) References Cited

U.S. PATENT DOCUMENTS

| | | | | |
|---|---|---|---|---|
| 5,553,014 A | * | 9/1996 | De Leon et al. | 708/322 |
| 5,608,804 A | * | 3/1997 | Hirano | 381/71.12 |
| 5,638,311 A | * | 6/1997 | Fujii et al. | 708/322 |
| 5,790,440 A | * | 8/1998 | Fujii et al. | 708/322 |
| 5,838,524 A | | 11/1998 | Phillips | |
| 6,570,985 B1 | * | 5/2003 | Romesburg | 379/406.08 |
| 6,650,756 B1 | * | 11/2003 | Saito et al. | 381/71.12 |

* cited by examiner

*Primary Examiner*—Young T. Tse
(74) *Attorney, Agent, or Firm*—Brinks Hofer Gilson & Lione

(57) ABSTRACT

In an adaptive audio equalizer apparatus, a signal that is output from an adaptive filter 13 is fed to a speaker and to a delaying unit. The signal fed to the delaying unit is delayed for a predetermined time, and is multiplied by a scaling factor in a multiplying unit. A first calculation unit calculates a difference between an output of a microphone and a target response signal, and outputs the result as an error signal. A second calculation unit adds the output of the multiplying unit to the error signal, and outputs the result to a filter coefficient setting unit of the adaptive filter.

20 Claims, 5 Drawing Sheets

FIG. 2

$$\begin{bmatrix} w_0(n+1) \\ w_1(n+1) \\ \vdots \\ w_{m-1}(n+1) \end{bmatrix} = \begin{bmatrix} w_0(n) \\ w_1(n) \\ \vdots \\ w_{m-1}(n) \end{bmatrix} + \mu \begin{bmatrix} x(n) & x(n-1) & \cdots & x(n-l) \\ x(n-1) & x(n-2) & \cdots & x(n-l-1) \\ \vdots & \vdots & & \vdots \\ x(n-m) & x(n-m-1) & \cdots & x(n-l-m+1) \end{bmatrix} \begin{bmatrix} c_0 \\ c_1 \\ \vdots \\ c_{l-1} \end{bmatrix} e(n)$$

$$\begin{bmatrix} w_0(n+1) \\ w_1(n+1) \\ \vdots \\ w_{m-1}(n+1) \end{bmatrix} = \begin{bmatrix} w_0(n) \\ w_1(n) \\ \vdots \\ w_{m-1}(n) \end{bmatrix} + \mu \begin{bmatrix} x(n) & x(n-1) & \cdots & x(n-l) \\ x(n-1) & x(n-2) & \cdots & x(n-l-1) \\ \vdots & \vdots & & \vdots \\ x(n-m) & x(n-m-1) & \cdots & x(n-l-m+1) \end{bmatrix} \begin{bmatrix} c_0 \\ c_1 \\ \vdots \\ c_{l-1} \end{bmatrix} \{e(n)+a(n)\}$$

$$= w(n) + \mu X c \{e(n)+a(n)\}$$
$$= w(n) + \mu X c e(n) + \mu X c a(n)$$

ADAPTIVE AUDIO EQUALIZER APPARATUS AND METHOD OF DETERMINING FILTER COEFFICIENT

BACKGROUND OF THE INVENTION

1. Field of the Invention

The present invention relates to adaptive audio equalizer apparatuses in which effects on acoustic signals due to transmission characteristics of the signal path are automatically compensated. More particularly, the present invention relates to an adaptive audio equalizer apparatus in which ringing is prevented, and to a method of determining a filter coefficient for the adaptive audio equalizer apparatus.

2. Description of the Related Art

When sound such as music is reproduced by an audio system, the sound waves undergo reflection and absorption during transmission over the signal path. The signal path has unique transmission characteristics, which alter the magnitude and phase of the sound waves differently for various frequency components, thereby producing degenerated sound. Thus, it is desired that the magnitude and phase of the audio signals be compensated on a frequency basis in accordance with the transmission characteristics of the signal path.

Adaptive audio equalizer apparatuses have been known as devices for automatically compensating, on a frequency basis, for the effects of the signal path on the magnitude and the phase of acoustic waves. FIG. 5 is a block diagram of a conventional adaptive audio equalizer apparatus. The adaptive audio equalizer apparatus includes an input terminal 31, a target response output unit 32, an adaptive filter 33, a speaker 34, a microphone 35, a calculation unit 36, and an FIR (Finite Impulse Response) filter 37. The adaptive filter 33 includes an FIR filter unit 33a, and a filter coefficient setting unit 33b for automatically setting, in accordance with the LMS (Least Mean Square) adaptation algorithm, a filter coefficient used in the FIR filter unit 33a.

The input terminal 31 receives an audio signal from a CD player, FM tuner, etc. The target response output unit 32 delays the audio signal that is input via the input terminal 31 for a predetermined period, and outputs a target response signal. The adaptive filter 33 adjusts on a frequency basis the magnitude and phase of the signal that is input via the input terminal 31. The speaker 34 outputs the signal fed from the adaptive filter 33 to the acoustic space to produce the corresponding sound.

The microphone 35 is provided at a listening point in the acoustic space, detects the sound waves produced from the speaker 34, and converts the detected sound waves into an electric signal. The calculation unit 36 calculates the difference between the target response signal that is output from the target response output unit 32 and the signal that is output from the microphone 35, and provides the result as an error signal. The FIR filter 37 approximates the transmission characteristics of the acoustic space C with respect to the signal path from the speaker 34 to the microphone 35, compensates the audio signal in accordance with the transmission characteristics, and provides the output to the adaptive filter 33.

The sound waves that are output from the speaker 34 to the acoustic space are altered in accordance with the transmission characteristics of the signal path while travelling to the microphone 35. In order to match the signal that is output from the microphone 35 and the target response signal, the adaptive filter 33 continually updates the filter coefficient so as to minimize the power of the error signal. The adaptive filter 33 adjusts the magnitude and the phase of the audio signal on a frequency basis in accordance with the filter coefficient. Accordingly, effects of the signal path on the audio signal are compensated, so that sound of desired quality is produced.

In the adaptive audio equalizer apparatus as described above, if the frequency characteristics of the signal detected by the microphone 35 exhibit a dip as shown in FIG. 6A, the adaptive filter 33, with regard to the filter characteristics (frequency-gain characteristics) thereof, forms a peak corresponding to the frequency of the dip, as shown in FIG. 6B, in order to achieve flat frequency characteristics of the signal that is output from the microphone 35.

However, when a very high peak is required in the frequency characteristics of the filter, the peak value may not be in a range that the construction of the filter allows. Furthermore, it is often the case that the dip is not present in the frequency characteristics of the sound waves at positions other than where the microphone 35 is disposed. In that case, over-compensated sound with an excessive peak in the frequency characteristics is generated, causing what is called ringing, which sounds uncomfortable to the listener.

SUMMARY OF THE INVENTION

Accordingly, it is an object of the present invention to provide an adaptive audio equalizer and a method of determining a filter coefficient therefor, which serves to produce desired sound through compensation in accordance with the transmission characteristics of the signal path, and to inhibit excessive compensation and therefore to inhibit ringing.

To this end, according to one aspect of the present invention, there is provided an adaptive audio equalizer apparatus having an adaptive filter including a finite impulse response filter unit, and a filter coefficient setting unit for determining a filter coefficient for the finite impulse response filter unit, the adaptive filter being for compensating an input signal that is input to the finite impulse response filter unit; a target response output unit for providing a target response signal; a speaker to which a signal that is output from the adaptive filter is supplied; a microphone for detecting acoustic waves produced by the speaker and converting them into an electric signal; a first calculation unit for calculating a difference between a signal that is output from the microphone and the target response signal, and for providing the result as an error signal; a delaying and multiplying unit for delaying an output of the adaptive filter and multiplying it by a scaling factor; and a second calculation unit for adding an output of the delaying and multiplying unit and the error signal, and for providing the result to the filter coefficient setting unit of the adaptive filter.

Preferably, the adaptive filter updates the filter coefficient so as to minimize the power of the signal supplied to the filter coefficient setting unit.

It is also preferable that the signal that is input to the finite impulse response filter unit is an aperiodic signal such as a white noise signal, so that there is no correlation between the signal that is input to the finite impulse response filter unit and the signal that is input to the filter coefficient setting unit.

According to another aspect of the present invention, there is provided an adaptive audio equalizer apparatus having an adaptive filter including a finite impulse response filter unit, and a filter coefficient setting unit for determining a filter coefficient for the finite impulse response filter unit, the adaptive filter being for compensating an input signal that is input to the finite impulse response filter unit; a target response output unit for providing a target response signal; a speaker to which a signal output from the adaptive filter is supplied; a microphone for detecting acoustic waves output from the speaker and converting them into an electric signal; a first calculation unit for calculating a difference between a signal that is output from the microphone and the target response signal, and for providing the result as an error signal; a noise signal source for generating a particular noise signal having no correlation to the input signal; a finite impulse response filter, in which the same coefficient as in the adaptive filter is set, for compensating the particular noise signal input from the noise signal source; a multiplying unit for multiplying an output of the finite impulse response filter by a scaling factor; and a second calculation unit for adding an output of the multiplying unit and the error signal, and for providing the result to the filter coefficient setting unit of the adaptive filter.

Accordingly, when there is an excessive peak at a frequency in the filter characteristics of the adaptive filter, the filter coefficient setting unit recognizes a large error at that frequency, thereby updating the filter coefficient so as to reduce the peak. Thus, an excessive peak in the filter characteristics is inhibited, thereby inhibiting ringing which sounds uncomfortable to the listener.

BRIEF DESCRIPTION OF THE DRAWINGS

FIG. 2 shows a formula for updating a filter coefficient in a typical adaptive filter based on the Filtered-X-LMS algorithm;

FIG. 3 shows a formula for updating a filter coefficient in an adaptive filter in the first embodiment of the present invention;

DESCRIPTION OF THE PREFERRED EMBODIMENTS

Figure 1:
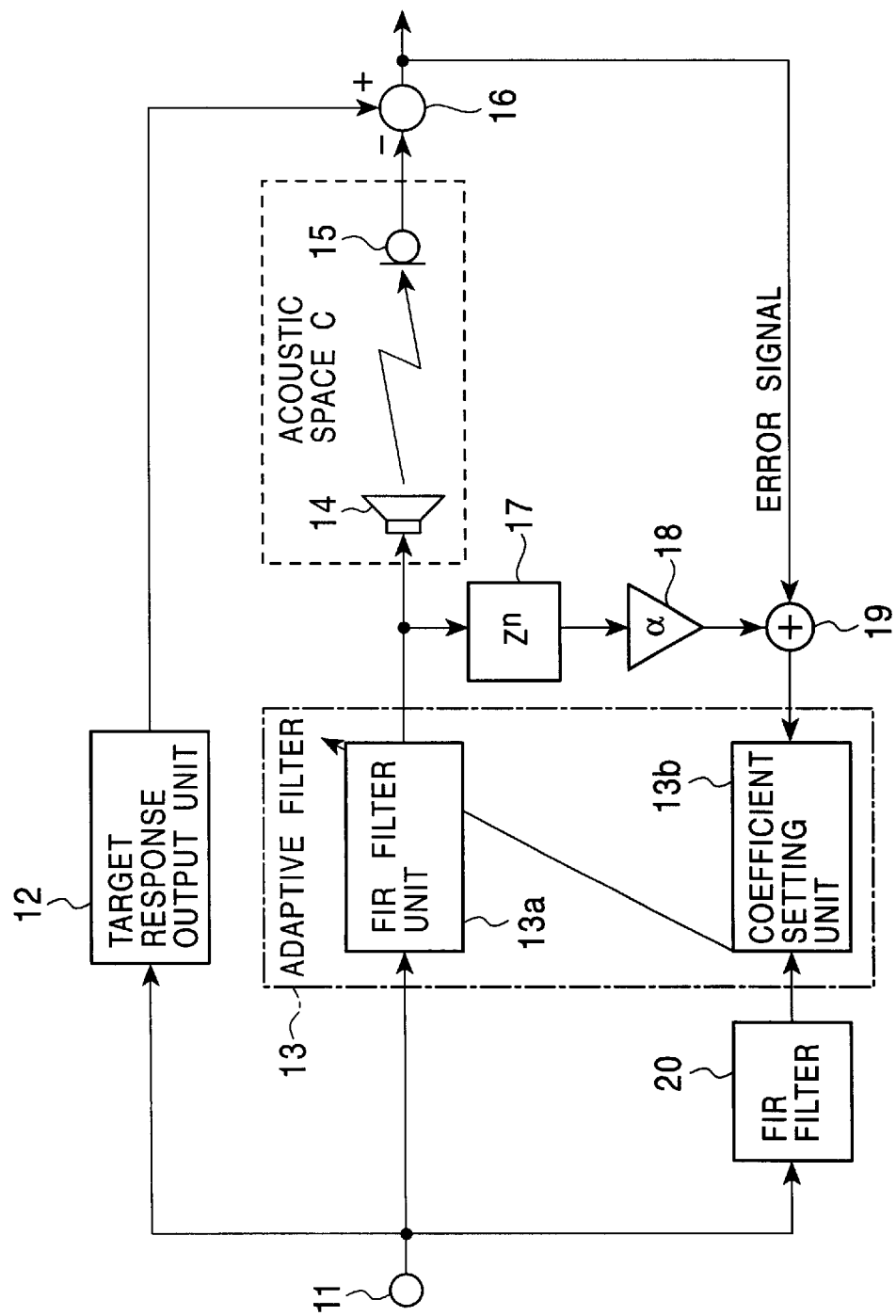
FIG. 1 is a block diagram of an adaptive audio equalizer according to a first embodiment of the present invention.

Preferred embodiments of the present invention will now be described with reference to the accompanying drawings.
First Embodiment FIG. 1 is a block diagram of an adaptive audio equalizer apparatus according to a first embodiment of the present invention.

The adaptive audio equalizer apparatus according to the first embodiment includes an input terminal 11, a target response output unit 12, an adaptive filter 13, a speaker 14, a microphone 15, a calculation unit 16, a delaying unit 17, a scaling factor multiplying unit 18, another calculation unit 19, and an FIR filter 20. The adaptive filter 13 includes an FIR filter unit 13a, and a filter coefficient setting unit 13b for setting a filter coefficient of the FIR filter unit 13a based on the LMS adaptation algorithm.

The input terminal 11 receives an audio signal from a CD player, an FM tuner, etc. When determining the filter coefficient of the adaptive filter 13, however, an aperiodic signal such as a white noise signal is input to the input terminal 11.

The target response output unit 12 delays the signal that is input via the input terminal 11 for a predetermined time corresponding to approximately half the number of taps of the adaptive filter 13.

The adaptive filter 13 adjusts the amplitude and the phase of the input signal on a frequency basis. The signal output from the adaptive filter 13 is fed to the speaker 14 and to the delaying unit 17. The speaker 14 converts the received signal into sound waves that are output to the acoustic space C. The delaying unit 17 delays the signal fed from the adaptive filter 13 for a predetermined time, and outputs it to the scaling factor multiplying unit 18. The scaling factor multiplying unit 18 multiplies the signal delayed by the delaying unit 17 by a scaling factor $\alpha$, and outputs it to the calculation unit 19.

The microphone 15 is provided at a listening point, and receives the sound output from the speaker 14 and converts it into an electric signal. The calculation unit 16 calculates the difference between the target response signal output from the target response output unit 12 and the output of the microphone 15, and outputs the result as an error signal. The calculation unit 19 adds the output of the multiplying unit 18 and the error signal, and outputs the sum to the filter coefficient setting unit 13b of the adaptive filter 13. The filter coefficient setting unit 13b continually updates the filter coefficient of the FIR filter unit 13a so as to minimize the power of the signal output from the calculation unit 19. The FIR filter 20 approximates the transmission characteristics of the acoustic space C, compensating the signal that is input via the input terminal 11 in accordance with the transmission characteristics of the acoustic space C and providing an output to the coefficient setting unit 13b of the adaptive filter 13.

The operation of the adaptive audio equalizer apparatus according to the first embodiment is described below. The adaptive audio equalizer apparatus continually updates the filter coefficient of the adaptive filter 13 so as to minimize the power of the signal indicating the difference between the output signal of the microphone 15 and the target response signal. In the adaptive audio equalizer apparatus according to the first embodiment, when there is an excessive peak in the filter characteristics of the adaptive filter 13, the power of the signal that is output from the calculation unit 19 becomes larger. Accordingly, the adaptive filter 13 recognizes a large error at the corresponding frequency, thus operating so as to reduce the peak. Therefore, an excessive peak in the filter characteristics is inhibited, and therefore, ringing is avoided.

The operation will be described below more in detail.

The adaptive filter based on the Filtered-X-LMS algorithm typically updates a filter coefficient in accordance with the updating formula shown in FIG. 2, wherein m indicates the number of taps in the adaptive filter 13, 1 indicates the number of taps in the FIR filter 20, and $\mu$ indicates the step-size parameter of the adaptive filter 13. w(n+1) (=$w_0$(n+1) to $w_{m1}$(n+1)) indicates an updated filter coefficient, w(n) (=$w_0$(n) to $w_{m-1}$(n)) indicates a filter coefficient before updating, Xc indicates an output C of the filter 20, c (=$c_0$ to $c_{1-1}$) indicates transmission characteristics of the acoustic space C, and e(n) indicates an error signal.

In accordance with the first embodiment, an output y(n) of the adaptive filter 13 is delayed in the delaying unit 17, and is multiplied in the multiplying unit 18 by a scaling factor $\alpha$a, obtaining a signal a(n). Then, the signal a(n) is added to the error signal e(n) (FIG. 3).

If the signal a(n) has a correlation with an input matrix X, $\mu$Xca(n) does not become 0, prohibiting the adaptive filter from converging.

Thus, in order that the signal a(n) has no correlation to the input matrix X, an aperiodic signal such as a white noise is used as the input signal, and a delay time corresponding to not less than (m+1−1) taps is required for the delaying unit 17. When the filter coefficient converges to obtain a fixed coefficient, an FIR filter having the obtained coefficient is used.

In accordance with the first embodiment, an excessive peak in the filter characteristics is inhibited, thus suppressing uncomfortable sound caused by ringing at positions other than where the microphone is disposed.

Second Embodiment

Figure 4:
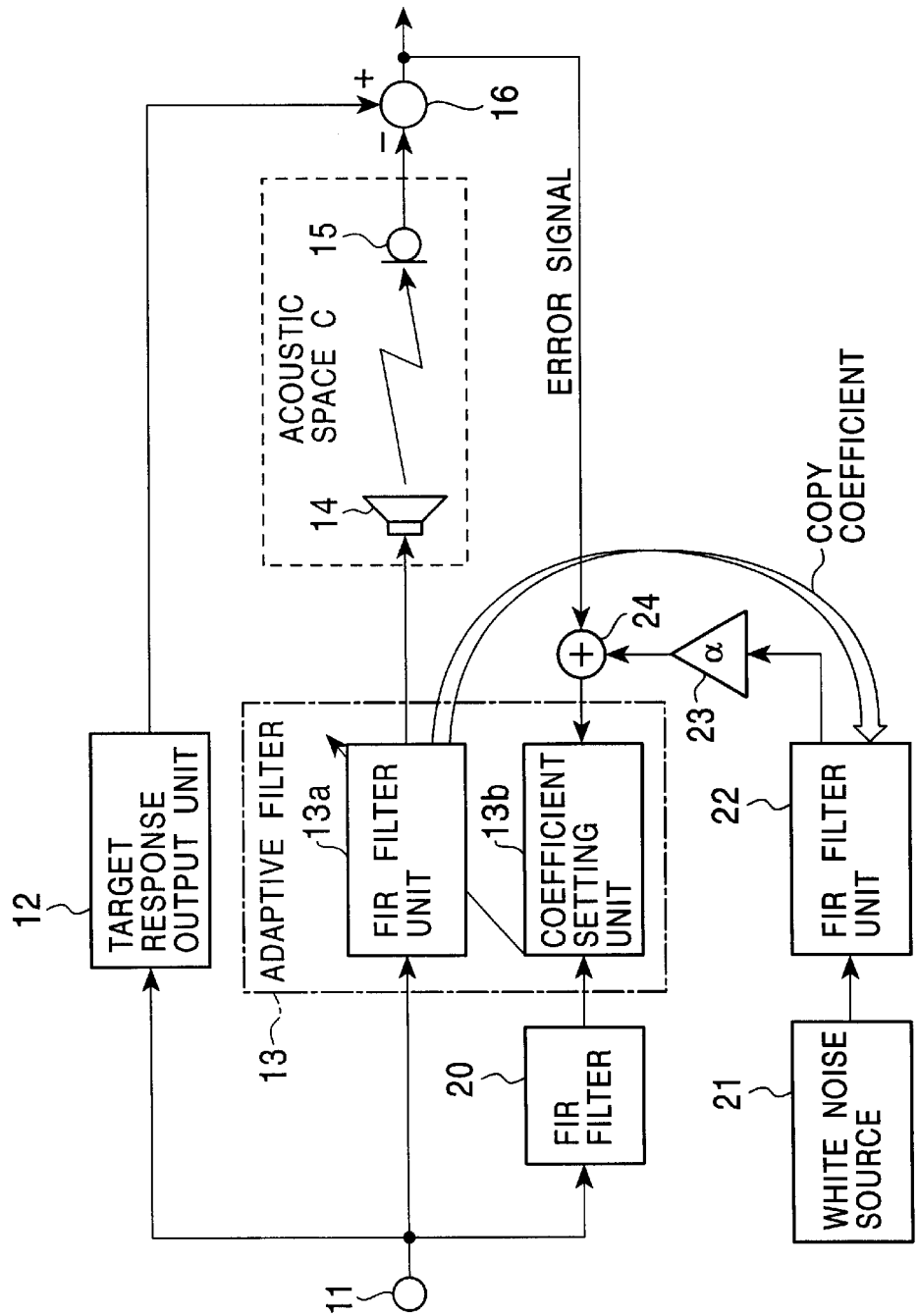
FIG. 4 is a block diagram of an adaptive audio equalizer according to a second embodiment of the present invention.
Figure 5:
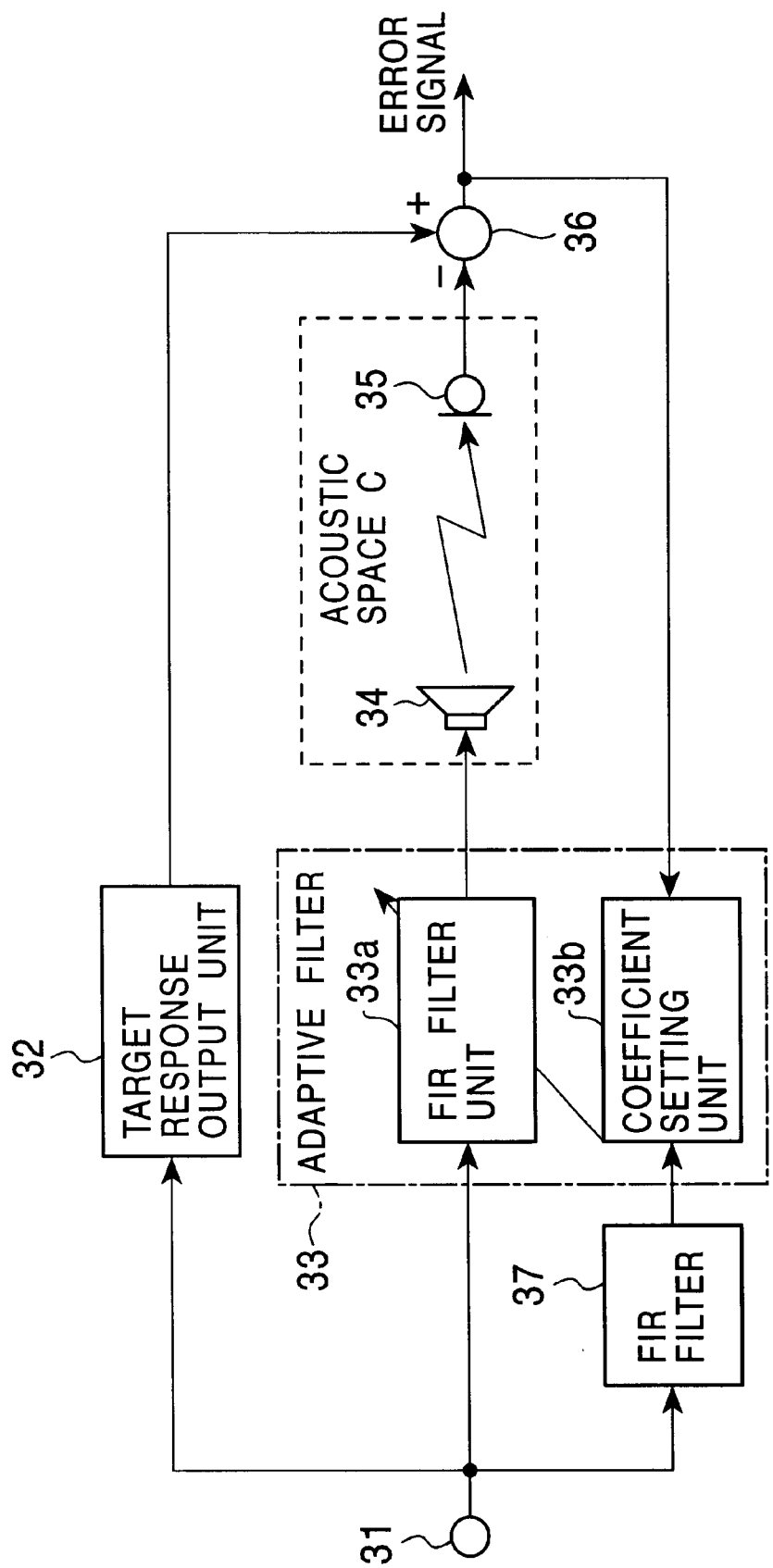
FIG. 5 is a block diagram of a conventional adaptive audio equalizer.
Figure 6A:
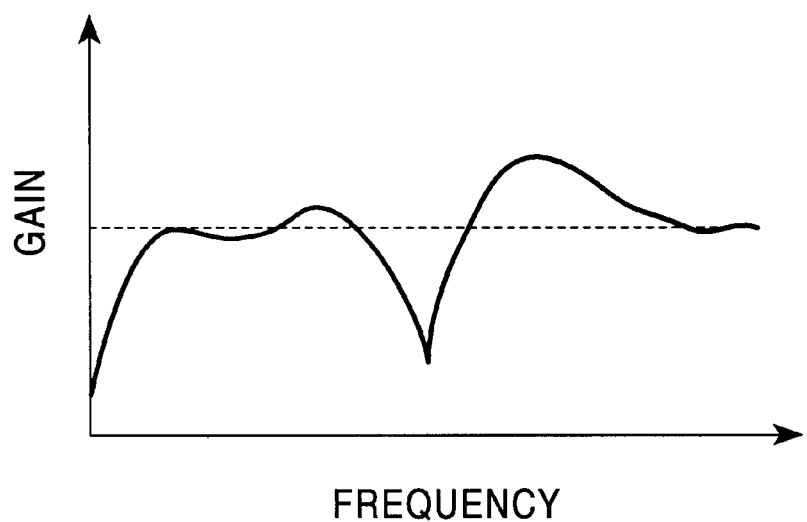
FIG. 6A is a graph showing the frequency characteristics of a signal having a dip.
Figure 6B:
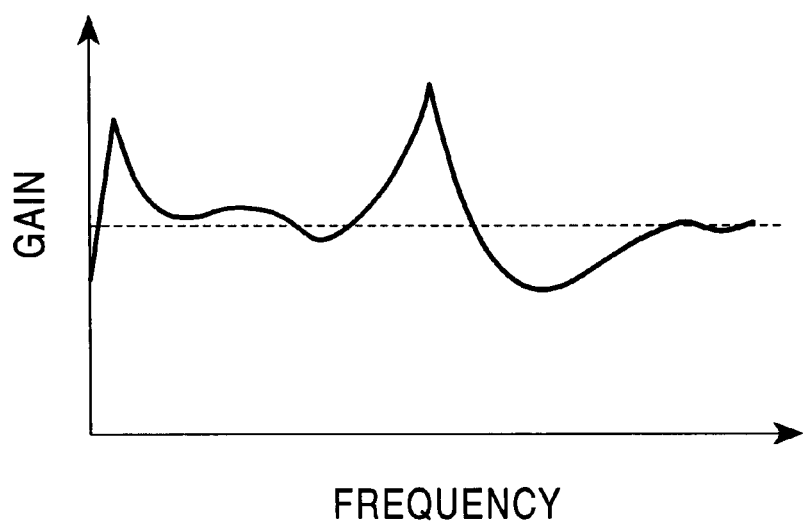
FIG. 6B is a graph showing the filter characteristics of an adaptive filter adapted for the signal shown in FIG. 6A.

FIG. 4 is a block diagram of an adaptive audio equalizer apparatus according to a second embodiment of the present invention. In FIG. 4, components identical to those in FIG. 1 are indicated by the same reference characters, and detailed description thereof is omitted.

Referring to FIG. 4, the adaptive equalizer according to the second embodiment includes an input terminal 11, a target response output unit 12, an adaptive filter 13, a speaker 14, a microphone 15, a calculation unit 16, a white noise source 21, an FIR filter 20, another FIR filter 22, a scaling factor multiplying unit 23, and another calculation unit 24. A signal that is input via the input terminal 11 is compensated in the adaptive filter 13 and then is supplied to the speaker 14. The calculation unit 16 calculates a difference between a target response signal and an output of the microphone 15, thereby producing an error signal.

When a filter coefficient of an FIR filter unit 13 of the adaptive filter 13 is updated, the updated filter coefficient is copied to the FIR filter 22. A white noise signal that is output from the white noise source 21 is compensated in the FIR filter 22, and is then multiplied by a scaling factor in the scaling factor multiplying unit 23.

A calculation unit 24 adds the output of the scaling factor multiplying unit 23 to the error signal and outputs the result to a filter coefficient setting unit 13b of the adaptive filter 13. The filter coefficient setting unit 13b continually updates the filter coefficient for the FIR filter unit 13a so as to minimize the power of the signal that is output from the calculation unit 24.

When a large peak is generated in the filter characteristics of the adaptive filter 13, because the FIR filter 22 has the same filter coefficient as the FIR filter unit 13a, the signal that is output from the FIR filter 22 also has a large peak at the corresponding frequency. The signal is multiplied by a scaling factor, and then is added to the error signal. The sum is input to the filter coefficient setting unit 13b. Thus, the filter recognizes a large error at the frequency of the peak, thereby updating the filter coefficient of the filter coefficient setting unit 13a so as to reduce the peak. Thus, the peak in the filter characteristics of the adaptive filter 13 is reduced.

In accordance with the second embodiment, the white noise source which generates a white noise having no correlation to the input signal is provided, thus eliminating the delaying unit 17 of the first embodiment. Furthermore, the second embodiment allows setting of the filter coefficient while an audio signal is being input to the input terminal 11.

What is claimed is:

1. An adaptive audio equalizer apparatus comprising:
   an adaptive filter including a finite impulse response filter unit, and a filter coefficient setting unit for determining a filter coefficient for said finite impulse response filter unit, said adaptive filter being for compensating an input signal that is input to said finite impulse response filter unit;
   a target response output unit for providing a target response signal;
   a speaker to which a signal that is output from said adaptive filter is supplied;
   a microphone for detecting an acoustic wave that is output from said speaker and converting it into an electric signal;
   a first calculation unit for calculating a difference between a signal that is output from said microphone and the target response signal, and for providing the result as an error signal;
   a delaying and multiplying unit for delaying the output of said adaptive filter and multiplying it by a scaling factor; and
   a second calculation unit for adding the output of said delaying and multiplying unit to said error signal, and for providing the result to said filter coefficient setting unit of said adaptive filter.

2. An adaptive audio equalizer apparatus according to claim 1, wherein said adaptive filter adjusts the magnitude and phase of the input signal on a frequency basis.

3. An adaptive audio equalizer apparatus according to claim 1, wherein an aperiodic signal is input as the input signal in determining the filter coefficient of said adaptive filter.

4. An adaptive audio equalizer apparatus according to claim 1, wherein said target response output unit has a delay time corresponding to approximately half the number of taps of said adaptive filter.

5. An adaptive audio equalizer apparatus according to claim 1, wherein said filter coefficient setting unit updates the filter coefficient of said finite impulse response filter unit so as to minimize the power of the signal that is output from said second calculation unit.

6. An adaptive audio equalizer apparatus comprising:
   an adaptive filter including a finite impulse response filter unit, and a filter coefficient setting unit for determining a filter coefficient for said finite impulse response filter unit, said adaptive filter being for compensating an input signal that is input to said finite impulse response filter unit;
   a target response output unit for providing a target response signal;
   a speaker to which a signal that is output from said adaptive filter is supplied;
   a microphone for detecting an acoustic wave that is output from said speaker and converting it into an electric signal;
   a first calculation unit for calculating a difference between a signal that is output from said microphone and the target response signal, and for providing the result as an error signal;
   a noise signal source for generating a particular noise signal having no correlation to the input signal;
   a finite impulse response filter, in which the same coefficient as in said adaptive filter is set, for compensating the particular noise signal that is input from said noise signal source;
   a multiplying unit for multiplying the output of said finite impulse response filter by a scaling factor; and
   a second calculation unit for adding the output of said multiplying unit and said error signal, and for providing the result to said filter coefficient setting unit of said adaptive filter.

7. An adaptive audio equalizer apparatus according to claim 6, wherein said adaptive filter adjusts the magnitude and phase of the input signal ona frequency basis.

8. An adaptive audio equalizer apparatus according to claim 6, wherein said target response output unit has a delay time corresponding to approximately half the number of taps of said adaptive filter.

9. An adaptive audio equalizer apparatus according to claim 6, wherein the particular noise signal generated by said noise signal source is an aperiodic signal.

10. An adaptive audio equalizer apparatus according to claim 6, wherein said filter coefficient setting unit updates the filter coefficient of said finite impulse response filter unit so as to minimize the power of the signal that is output from said second calculation unit.

11. A method of determining a filter coefficient in an adaptive audio equalizer apparatus in which a signal that is input via an input terminal is compensated in an adaptive filter and is then supplied to a speaker, and in which a difference between a signal that is output from a microphone and a target response signal serves as an error signal, said method comprising:

delaying an output of said adaptive filter in a delaying unit;

multiplying the delayed signal by a scaling factor;

adding the multiplied signal to said error signal; and inputting the sum to a filter coefficient setting unit, whereby the output of said adaptive filter is converged to determine said filter coefficient.

12. A method of determining a filter coefficient according to claim 11, wherein an aperiodic signal is input as the input signal in determining said filter coefficient.

13. A method of determining a filter coefficient according to claim 11, wherein a delay time of said delaying unit is not less than a time corresponding to (m+1−1) taps, m being the number of taps of said adaptive filter and 1 being the number of taps of a finite impulse response filter for approximating an acoustic space.

14. A method of determining a filter coefficient according to claim 11, wherein said adaptive filter adjusts the magnitude and phase of the input signal on a frequency basis.

15. A method of determining a filter coefficient according to claim 11, wherein said filter coefficient setting unit updates said filter coefficient so as to minimize the power of the signal representing the sum of the signal delayed by said delaying unit and said error signal.

16. A method of determining a filter coefficient in an adaptive audio equalizer apparatus in which a signal that is input via an input terminal is compensated in an adaptive filter and is then supplied to a speaker, and in which a difference between a signal that is output from a microphone and a target response signal serves as an error signal, said method comprising:

inputting a particular noise signal, having no correlation to the input signal, to a finite impulse response filter in which the same filter coefficient as in said adaptive filter is set;

multiplying an output of said finite impulse response filter by a scaling factor;

adding the multiplied signal to said error signal; and inputting the sum to a filter coefficient setting unit of said adaptive filter;

whereby the output of said adaptive filter is converged to determine said filter coefficient.

17. A method of determining a filter coefficient according to claim 16, wherein said adaptive filter adjusts the magnitude and phase of the input signal on a frequency basis.

18. A method of determining a filter coefficient according to claim 16, wherein said particular noise signal is an aperiodic signal.

19. A method of determining a filter coefficient according to claim 18, wherein said particular noise signal is a white noise signal.

20. A method of determining a filter coefficient according to claim 16, wherein said filter coefficient setting unit updates said filter coefficient so as to minimize the power of the signal representing the sum of the multiplied signal and said error signal.

* * * * *